(12) United States Patent
Ebihara et al.

(10) Patent No.: US 7,145,227 B2
(45) Date of Patent: Dec. 5, 2006

(54) STACKED MEMORY AND MANUFACTURING METHOD THEREOF

(75) Inventors: Nobuaki Ebihara, Kanagawa (JP); Naoshi Suzuki, Kanagawa (JP)

(73) Assignee: NEC Toshiba Space Systems, Ltd., Kanagawa (JP)

( * ) Notice: Subject to any disclaimer, the term of this patent is extended or adjusted under 35 U.S.C. 154(b) by 21 days.

(21) Appl. No.: 10/901,168

(22) Filed: Jul. 29, 2004

(65) Prior Publication Data

US 2005/0023668 A1 Feb. 3, 2005

(30) Foreign Application Priority Data

Jul. 31, 2003 (JP) ............... 2003-283598

(51) Int. Cl.
*H01L 23/48* (2006.01)

(52) U.S. Cl. ............ 257/686; 257/692; 257/673; 257/693; 257/698; 257/696; 257/737

(58) Field of Classification Search ............ 257/686, 257/692, 673, 693, 698, 696, 737
See application file for complete search history.

(56) References Cited

U.S. PATENT DOCUMENTS

| 5,371,560 | A | * | 12/1994 | Kiehne et al. ............ 353/120 |
| 5,377,077 | A | | 12/1994 | Burns |
| 5,397,916 | A | | 3/1995 | Normington |
| 5,744,827 | A | | 4/1998 | Jeong et al. |
| 5,840,417 | A | | 11/1998 | Bolger |
| 6,238,599 | B1 | | 5/2001 | Gelorme et al. |
| 6,424,031 | B1 | | 7/2002 | Glenn |
| 2002/0017710 | A1 | | 2/2002 | Kurashima et al. |

FOREIGN PATENT DOCUMENTS

| JP | 05-191028 A | 7/1993 |
| JP | 11-111914 A | 4/1999 |
| JP | 11-137516 A | 5/1999 |
| JP | 2000-031617 A | 1/2000 |
| JP | 2000-286380 A | 10/2000 |
| JP | 2002-009227 A | 1/2002 |
| WO | WO 99/65062 A2 | 12/1999 |
| WO | WO 01/06562 A1 | 1/2001 |

\* cited by examiner

*Primary Examiner*—Long Pham
(74) *Attorney, Agent, or Firm*—Sughrue Mion, PLLC

(57) ABSTRACT

To mount a TSOP on an interposer substrate, leads provided to the TSOP are joined to pads of the interposer substrate by a thermosetting conductive resin, and the TSOP exclusive of the leads is joined to ground layers formed in the interposer substrate by a thermosetting conductive resin. The interposer substrates with the TSOPs mounted thereon are stacked in eight layers in such a manner that the TSOPs face downward. Then, leads of the upper interposer substrate are joined to pads formed in the rear face of the lower interposer substrate by a thermosetting conductive resin, so that the interposer substrates adjacent in a vertical direction are connected.

12 Claims, 3 Drawing Sheets

STACKED MEMORY AND MANUFACTURING METHOD THEREOF

BACKGROUND OF THE INVENTION

1. Field of the Invention

The present invention relates to a stacked memory in which a plurality of semiconductor devices are stacked and a manufacturing method thereof. In particular, the present invention relates to a stacked memory used in a harsh environment and a manufacturing method thereof.

2. Description of the Related Art

A stacked memory is composed of a plurality of stacked semiconductor devices, each of which is packaged in a CSP (Chip Size Package), a TSOP (Thin Small Outline Package), or the like. The stacked memory is mounted on a motherboard together with other electronic components to compose a semiconductor memory device or the like. The semiconductor memory device in which the stacked memory is installed, for example, does not need a mechanical drive section and rotation section, which are necessary in a magnetic tape recorder and a hard disk, and operates at high speed with low power consumption. Thus, it is considered that the semiconductor memory device with the stacked memory is applied to a device for temporarily storing satellite data, that is, a data recorder.

FIGS. 1 and 2 are perspective views showing conventional stacked memory. In a stacked memory 20, as shown in FIG. 1, for example, leads 21 of the CSPs, TSOPs, or the like are connected to a carrier substrate by soldering or the like to achieve multilayer packaging (refer to, for example, Japanese Patent Laid-Open Publication No. 135716/1999 and No. 031617/2000). As a stacked memory 30 shown in FIG. 2, another configuration has been practically used in which after a plurality of semiconductor devices are fixed by a mold material, lead surfaces are exposed by cutting, and then wiring is formed by a metallization method, a laser cut method or the like (refer to, for example, Japanese Patent Laid-Open Publication No. 286380/2000).

The foregoing conventional techniques, however, have the following problems. A semiconductor memory device used in artificial satellite equipment is exposed to a harsh environmental condition, for example, used in vacuum, under a large temperature variation, large vibration, and the like, so that high heat radiation and high resistance to vibration are required of the stacked memory mounted on the semiconductor memory like this.

In said stacked memory 20 shown in FIG. 1, a plurality of semiconductor devices are mounted in a stacked fashion by solder joints, and metal leads 21 are extended to a top face of the CSP or the TSOP in consideration of heat radiation. However, heat radiation from the TSOPs disposed in the middle layers is not considered. Since soldering is also used in joining metal leads 21 of the stacked memory 20, there are cases where solder in lead joints remelts when the stacked memory 20 is mounted on the motherboard. Thus, after the stacked memory is mounted on the motherboard, it is necessary to reconfirm portions, which have been joined by soldering before mounting. In equipment requiring high reliability such as equipment installed in an artificial satellite and the like, all solder joints are visually confirmed. In a case that the solder joints remelt, the solder joints have to be visually reconfirmed, and hence there is a problem that time involved in a manufacturing process and manufacturing is increased.

Furthermore, in said stacked memory 30 having structure shown in FIG. 2, semiconductor device packages such as the CSPs, TSOPs, and the like are just fixed by a mold material. Accordingly, there is a problem that positive measures against heat radiation with the use of a high heat conductive material such as metal and the like are not taken.

SUMMARY OF THE INVENTION

An object of the present invention is to provide stacked memory with high heat radiation and high resistance to vibration, which is easily manufactured and is installable in equipment used in a harsh environment such as artificial satellite equipment and the like.

A stacked memory according to the present invention includes a plurality of carrier substrates each of which has a ground layer and a semiconductor device mounted on the ground layer, the plurality of carrier substrates being stacked in layers; and a thermosetting conductive resin joining at least one of joints between leads of the semiconductor device and pads of the carrier substrate, between the semiconductor device and the ground layer, and between leads of the carrier substrates and another carrier substrate.

According to the present invention, the thermosetting conductive resin is used as a joint member for multilayer packaging of semiconductor devices, so that it is possible to prevent the remelting of the joint member by the application of heat. As a result, it becomes unnecessary to check the joint member whenever a heating process is carried out, and hence it is possible to simplify a manufacturing process. It is also possible to improve resistance to vibration because the thermosetting conductive resin has the effect of absorbing the vibration. Furthermore, since the semiconductor device is mounted on the ground layer formed in the carrier substrate, heat generated in the semiconductor device is dissipated through the ground layer. Therefore, it is possible to improve heat radiation.

Another stacked memory according to the present invention includes a plurality of carrier substrates each of which has a ground layer, a semiconductor device joined to the ground layer and having leads, pad being joined to the leads of the semiconductor device, and leads joined to pads or leads of the upper or lower adjacent carried substrate, the plurality of carrier substrates being stacked in layers; and a thermosetting conductive resin joining at least one of joints between the ground layer and the semiconductor device, between the leads of the semiconductor device and the pads of the carrier substrate, and between the leads of the carrier substrate and the pads or leads of the upper or lower adjacent carrier substrate.

According to the present invention, the thermosetting conductive resin is used as a joint member for installing the semiconductor devices, so that it is possible to prevent the remelting of the joint member in a manufacturing process. Thus, it is possible to omit a check process. Also, the semiconductor device is mounted on the ground layer, and heat generated in the semiconductor device is dissipated through the ground layer. Therefore, it is possible to improve heat radiation.

The semiconductor device is, for example, a thin small outline package, and the carrier substrate is, for example, an interposer substrate. Furthermore, the carrier substrate may comprise another ground layer formed in a face opposite to a face on which the semiconductor device is mounted. A semiconductor device mounted on another carrier substrate can be joined to the other ground layer by the thermosetting conductive resin. Since the ground layers are disposed over and under the semiconductor device, heat generated in the semiconductor devices is efficiently transmitted to ground leads. Therefore, it is possible to improve heat radiation.

A manufacturing method of a stacked memory according to the present invention includes the steps of joining leads of a semiconductor device to pads of a carrier substrate; joining the semiconductor device to a ground layer of the carrier substrate; and connecting leads of the carrier substrate to another carrier substrate, wherein a thermosetting conductive resin is used in at least one of the joining of the leads of the semiconductor device and the pads of the carrier substrate, the joining of the semiconductor device and the ground layer of the carrier substrate, and the connecting of the leads of the carrier substrate and another carrier substrate.

Another manufacturing method of a stacked memory according to the present invention includes the steps of joining a semiconductor device to a ground layer of a carrier substrate; joining leads of the semiconductor device to pads of the carrier substrate; and joining leads of the carrier substrate to pads or leads of an upper or lower adjacent carrier substrate after a plurality of the carrier substrates with the semiconductor devices joined thereto are stacked in layers, wherein a thermosetting conductive resin is used in at least one of the joining of the ground layer and the semiconductor device, the joining of the leads of the semiconductor device and the pads of the carrier substrate, and the joining of the leads of the carrier substrate and the pads or leads of the upper or lower adjacent carrier substrate.

A thin small outline package may be used as the semiconductor device, and an interposer substrate may be used as the carrier substrate. In the invention, a thermosetting resin may join the semiconductor device and the carrier substrate adjacent to each other.

According to the present invention, the thermosetting conductive resin is used as a joint member for multilayer packaging of semiconductor devices, so that it is possible to prevent the remelting of the joint member in a joint process. Thus, it is possible to simplify a manufacturing process and improve resistance to vibration. Furthermore, since the semiconductor device is mounted on the ground layer of the carrier substrate, it is possible to improve heat radiation. Therefore, the stacked memory is usable in equipment that is used in a harsh environment such as artificial satellite equipment.

DETAILED DESCRIPTION OF THE PREFERRED EMBODIMENT

Figure 1:
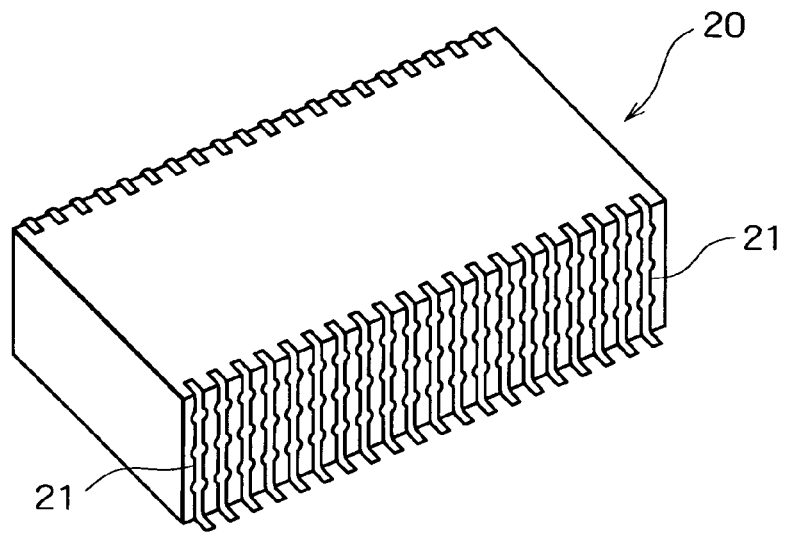
FIG. 1 is a perspective view of a conventional stacked memory.
Figure 2:
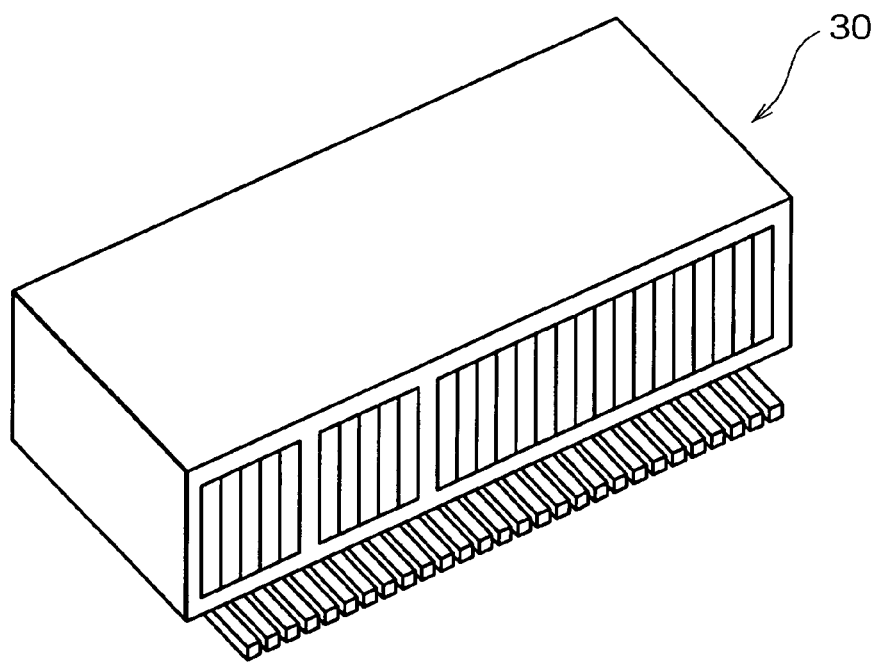
FIG. 2 is a perspective view of another conventional stacked memory.
Figure 3A:
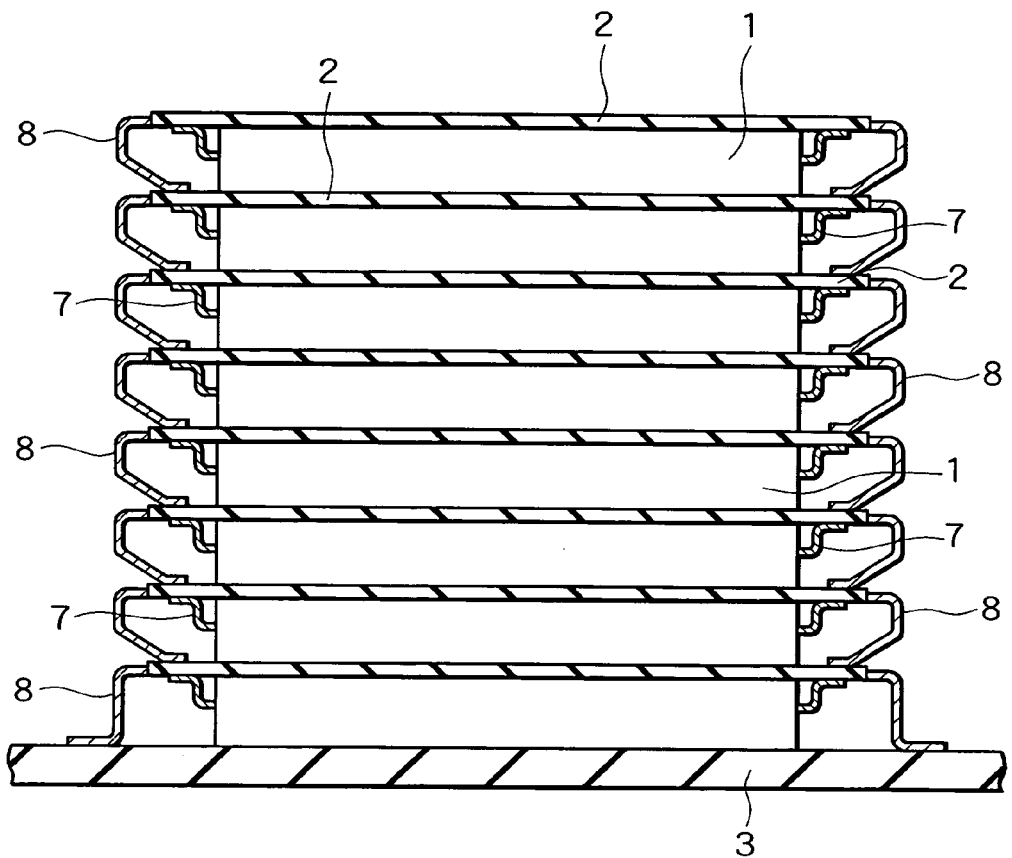
FIG. 3A is a sectional view of a stacked memory according to an embodiment of the present invention.
Figure 3B:
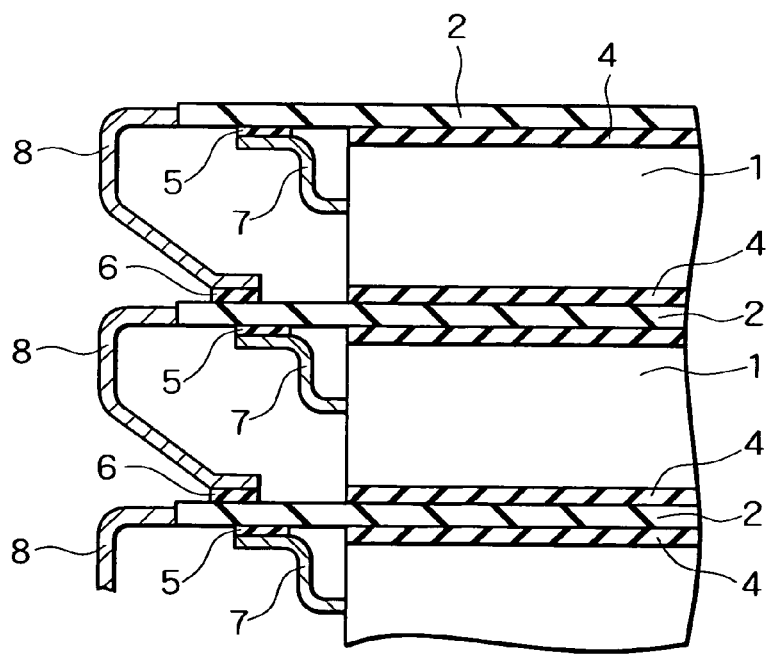
FIG. 3B is an enlarged sectional view of FIG. 3A.
Figure 4:
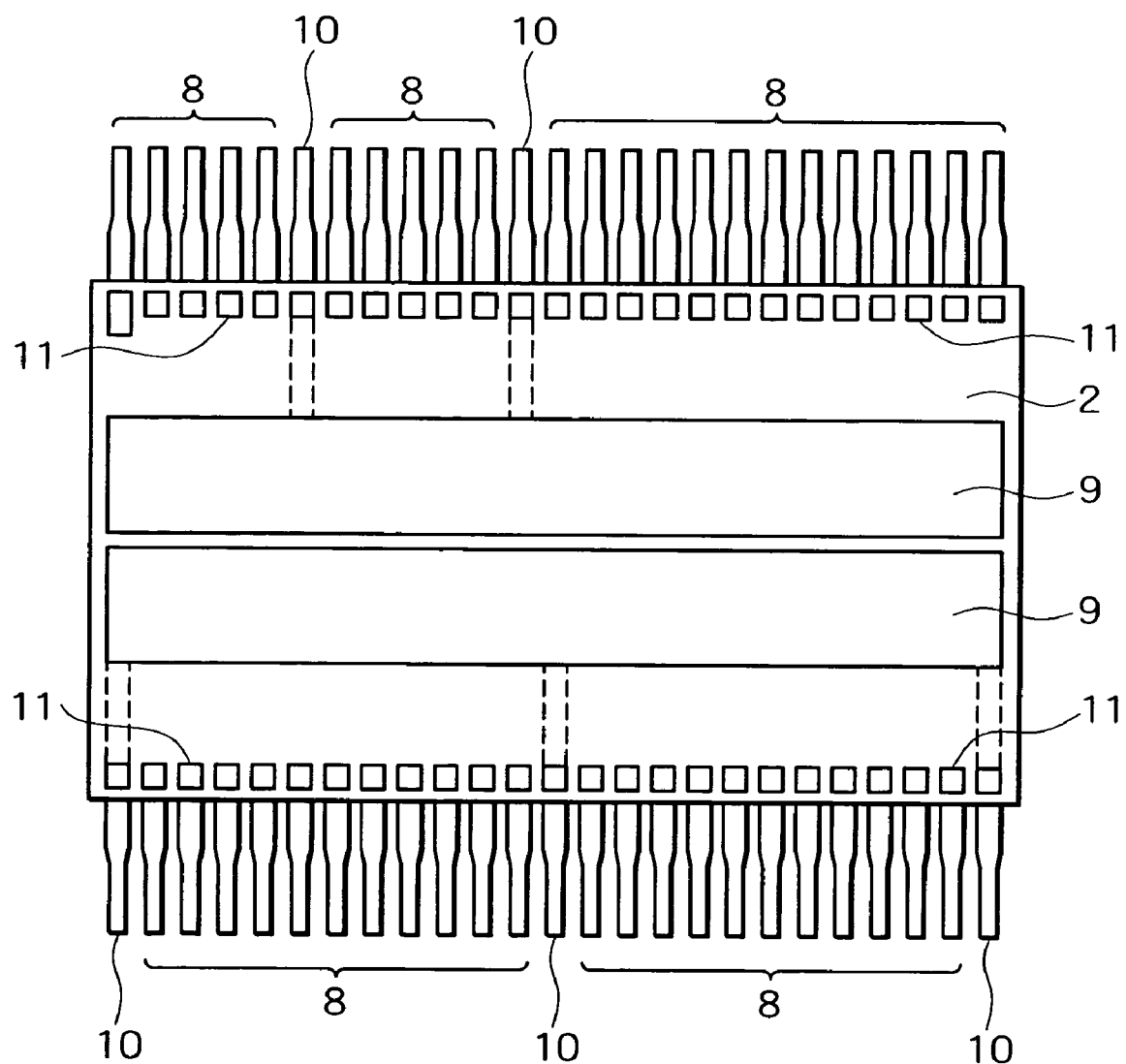
FIG. 4 is a plan view of an interposer substrate of the stacked memory according to the embodiment of the present invention.

A stacked memory according to an embodiment of the present invention will be hereinafter described in the concrete with reference to the accompanying drawings. In the stacked memory according to this embodiment, eight interposer substrates with TSOPs mounted thereon are stacked in layers. FIG. 3A is a sectional view showing the stacked memory according to this embodiment, and FIG. 3B is an enlarged sectional view of FIG. 3A. FIG. 4 is a plan view of an interposer substrate 2 shown in FIG. 2. Referring to FIGS. 3A, 3B, and 4, a TSOP 1 is provided with leads 7. Pads 11 and ground layers 9 are formed in each face of the interposer substrate 2. The pads 11 are connected to leads 8 or ground leads 10. The ground layers 9 are connected to the ground leads 10. The ground layers 9 and the ground leads 10 are at the same potential.

The TSOP 1 is joined to the ground layers 9 of the interposer substrate 2 by a thermosetting conductive resin 4, and leads 7 of the TSOP 1 are joined to the pads 11 of the interposer substrate 2 by a thermosetting conductive resin 5. Each interposer substrate 2 on which the TSOP 1 is mounted is stacked in such a manner that the TSOP 1 faces downward, and then the TSOP 1 is joined to the ground layer 9 provided in the rear face of the lower adjacent interposer substrate 2 by a thermosetting conductive resin 4. Furthermore, leads 8 provided in the upper interposer substrate 2 are joined to the pads 11 formed in the rear face of the lower interposer substrate 2 by a thermosetting conductive resin 6, to connect each interposer substrate 2.

Any commercially available thermosetting conductive resin can be used as the foregoing thermosetting conductive resins 4 to 6. Curing temperature of the thermosetting conductive resin is approximately 150 degrees centigrade in general, but it is preferable that the curing temperature is as low as possible in order to reduce a heat load in a manufacturing process. It is preferable that heatproof temperature after curing is, for example, approximately 250 to 300 degrees centigrade, which is higher than temperature in a reflow process. Small electric conductivity is preferable, but the commercially available conductive resin can be used without problem as to electric conductivity.

Next, a manufacturing method of the stacked memory according to this embodiment will be described. To manufacture the stacked memory according to this embodiment, the thermosetting conductive resin 4 is first applied to a TSOP 1 mounting portion of the interposer substrate 2. The thermosetting conductive resin 5 is applied to the pads 11, and then the TSOP 1 and the leads 7 are disposed in predetermined positions. After that, the thermosetting conductive resins 4 and 5 are cured by heating the interposer substrate 2 and the TSOP 1, so that the TSOP 1 and the leads 7 are joined to the interposer substrate 2. Thus, the TSOP 1 is mounted on the interposer substrate 2.

Then, the interposer substrates 2 with the TSOPs 1 mounted thereon are stacked in eight layers in such a manner that the TSOPs 1 face downward. At this time, the TSOP 1 is joined to the ground layer 10 formed in the rear face of the lower interposer substrate 2 by the thermosetting conductive resin 4. The interposer substrates 2 adjacent in a vertical direction join the leads 8 of the upper interposer substrate 2 to the pads 11 formed in the rear face of the lower interposer substrate 2 by the thermosetting conductive resin 6. Accordingly, it is possible to structure the stacked memory with the eight stacked TSOPs 1.

The stacked memory manufactured as described above is mounted on a memory substrate 3, to compose a semiconductor memory device.

In the stacked memory according to this embodiment, the thermosetting conductive resins 4 to 6 are used for fixing the TSOP 1, connecting the TSOP 1 to the interposer substrate 2, and connecting the interposer substrates 2 to each other. Therefore, displacement caused by vibration is easily absorbed as compared with the case of using a joint material made of a metal material such as solder, or the case of direct joint by use of welding or the like, and hence resistance to vibration is improved. In the stacked memory according to this embodiment, if displacement occurs by variation in temperature, each of the leads 8 of the interposer substrate 2 and the leads 7 of the TSOP 1 can absorb the displacement, so that poor connection caused by the variation in temperature is hard to occur.

Furthermore, in the thermosetting conductive resins 4 to 6, the molecular weight of the resin increases with curing, and the melting point thereof significantly increases as compared with before the curing. Thus, the thermosetting conductive resins 4 to 6 do not remelt at the same temperature as the curing temperature. As a result, it is unnecessary to check the joints whenever a joining process is carried out, though it is necessary in the case of solder joints, and hence it is possible to simplify the process of multilayer packaging of the TSOPs 1. Since it is also possible to reduce clearance in the joints, resistance to vibration is improved in addition to that the stacked memory becomes compact and light in weight.

In the stacked memory according to this embodiment, the TSOP 1 is joined to the ground layers 9, so that the stacked memory can provide high heat radiation as compared with the conventional stacked memory and the conventional stacked semiconductor device. Then, the heat radiation of the stacked memory according to this embodiment will be described, with taking a case that the uppermost TSOP 1 generates heat in a vacuum as an example. Heat radiation by use of heat conduction is generally carried out in a vacuum because air does not exist. First, heat generated in the uppermost TSOP 1 is transmitted to the interposer substrates 2 disposed over and under this TSOP 1 through the leads 7 of the TSPO 1. Then, the heat is transmitted to the TSOP 1 disposed under the interposer substrate 2 through the leads 8 of the interposer substrate 2. The heat is successively transmitted downward in a like manner. Furthermore, in the stacked memory according to this embodiment, the heat generated in the uppermost TSOP 1 is transmitted to the ground layers 9 formed in the interposer substrate 2 disposed under the TSOP 1, and the heat is dissipated by being transmitted from the ground layers 9 to the ground leads 10.

In the stacked memory according to this embodiment, the ground layers 9 are provided in the interposer substrate 2 disposed between the TSOPs 1, and the ground layers 9 are connected to the ground leads 10 at the same potential. Thus, the heat generated in the TSOP 1 is dissipated into the memory substrate 3 without any electrical problem. Accordingly, it is possible to dissipate the heat generated in the TSOP 1 through the metal leads which have a hundred or more times larger heat conductivity than a resin, so that it is possible to restrain increase in the temperature of the whole stacked memory.

In the stacked memory according to this embodiment, when a heating amount of the TSOP 1 is low, the ground layers 9 may not be provided in the rear face of the interposer substrate 2, and the TSOP 1 may not be joined to the interposer substrate 2 by the thermosetting conductive resin 4 in stacking the TSOPs 1. In this embodiment, the leads 8 of the interposer substrate 2 are joined to the pads formed in the rear face of the lower interposer substrate 2 to connect the interposer substrates 2. The present invention, however, is not limited thereto, and the leads 8 of the interposer substrates 2 adjacent in the vertical direction may be joined by the thermosetting conductive resin 6.

What is claimed is:

1. A stacked memory comprising:
   an upper carrier substrate having a ground layer formed on a lower face of said upper carrier substrate, and leads connected to pads that are formed on said lower face;
   a semiconductor device having leads; and
   a lower carrier substrate having pads formed on an upper face of said lower carrier substrate,
   wherein said semiconductor device is sandwiched between said ground layer of said upper carrier substrate and said upper face of said lower carrier substrate,
   wherein said leads of said upper carrier substrate are connected to said pads of said lower carrier substrate and said leads of said semiconductor device are connected to said pads formed on said lower face of said upper carrier substrate
   wherein a thermosetting conductive resin joins at least one of said leads of said semiconductor device and said pads of said upper carrier substrate, said semiconductor device and said ground layer, said leads of said upper carrier substrate and said pads of said lower carrier substrate, and said semiconductor device and said lower carrier substrate.

2. A stacked memory comprising:
   a plurality of carrier substrates alternatively arranged with a plurality of semiconductor devices;
   wherein each one of said plurality of carrier substrates has a ground layer formed on a lower surface thereof, pads formed on an upper surface and said lower surface thereof, and carrier leads connected to said pads,
   wherein each one of said plurality of semiconductor devices have leads and are disposed between said ground layer an upper adjacent carrier substrate and said upper face of a lower adjacent carrier substrate, said leads of said each one of said plurality of said semiconductor devices being connected to said pads of said lower surface of said upper adjacent carrier substrate,
   wherein said carrier leads of an upper adjacent carrier substrate are also connected the pads of a lower adjacent carrier substrate,
   wherein a thermosetting conductive resin joins at least one of said each one of said plurality of semiconductor devices and said ground layer of an upper adjacent carrier substrate, said leads of said each one of said plurality of semiconductor devices and said pads on said lower surface of an upper adjacent carrier substrate, and said carrier leads of each of said plurality of carrier substrates and said pads of said lower adjacent carrier substrate.

3. The stacked memory according to claim 1, wherein said semiconductor device is a thin small outline package, and said upper carrier substrate and said lower carrier substrate are interposer substrates.

4. The stacked memory according to claim 1, wherein said-lower carrier substrate has a ground layer formed on an upper face of said lower carrier substrate.

5. The stacked memory according to claim 4, wherein said semiconductor device is joined to said ground layer formed on said upper face of said lower carrier substrate by said thermosetting conductive resin.

6. The stacked memory according to claim 2, wherein said plurality of semiconductor devices are thin small outline packages, and said plurality of carrier substrates are interposer substrates.

7. The stacked memory according to claim 2, wherein said each one of said plurality of carrier substrates has a second ground layer formed on said upper surface.

8. The stacked memory according to claim 7, wherein each semiconductor device mounted on said plurality of carrier substrates is joined to said ground layer formed on said upper surface of said each one of said plurality of carrier substrates by said thermosetting conductive resin.

9. The stacked memory according to claim 1, wherein said thermosetting conductive resin has a heatproof temperature after curing of 250–300° C.

10. The stacked memory according to claim 2, wherein said thermosetting conductive resin has a heatproof temperature after curing of 250–300° C.

11. The stacked memory according to claim 1, wherein said heatproof temperature is higher than a temperature in a reflow process corresponding to mounting said stacked memory on a motherboard.

12. The stacked memory according to claim 2, wherein said heatproof temperature is higher than a temperature in a reflow process corresponding to mounting said stacked memory on a motherboard.

* * * * *